US012431687B2

United States Patent
Hartin et al.

(10) Patent No.: US 12,431,687 B2
(45) Date of Patent: Sep. 30, 2025

(54) MULTI-OCTAVE SPANNING MILLIMETER WAVE SOURCE WITH PHASE MEMORY

(71) Applicant: Raytheon Company, Waltham, MA (US)

(72) Inventors: Paul T. Hartin, McKinney, TX (US); Kalin Spariosu, El Segundo, CA (US); Michael R. Patrizi, Marlborough, MA (US)

(73) Assignee: Raytheon Company, Arlington, VA (US)

( * ) Notice: Subject to any disclaimer, the term of this patent is extended or adjusted under 35 U.S.C. 154(b) by 476 days.

(21) Appl. No.: 17/948,665

(22) Filed: Sep. 20, 2022

(65) Prior Publication Data

US 2023/0089039 A1 Mar. 23, 2023

Related U.S. Application Data

(60) Provisional application No. 63/247,051, filed on Sep. 22, 2021.

(51) Int. Cl.
*H01S 5/062* (2006.01)
*H01S 3/107* (2006.01)
*H01S 3/1109* (2023.01)
*H01S 5/026* (2006.01)
*H01S 5/06* (2006.01)
*H01S 5/0625* (2006.01)
*H01S 5/065* (2006.01)
*H01S 5/14* (2006.01)

(52) U.S. Cl.
CPC ........... *H01S 5/062* (2013.01); *H01S 5/0602* (2013.01); *H01S 5/0617* (2013.01); *H01S 5/06251* (2013.01); *H01S 5/06255* (2013.01); *H01S 5/0657* (2013.01); *H01S 3/107* (2013.01); *H01S 3/1109* (2013.01); *H01S 5/0265* (2013.01); *H01S 5/14* (2013.01)

(58) Field of Classification Search
None
See application file for complete search history.

(56) References Cited

U.S. PATENT DOCUMENTS

| 7,373,088 B2 | 5/2008 | Yap et al. |
| 10,050,704 B1 | 8/2018 | Yap |
| 2002/0006141 A1* | 1/2002 | Ogura ............... H01S 5/06255 372/18 |

(Continued)

FOREIGN PATENT DOCUMENTS

| WO | 2003043231 A2 | 5/2003 | |
| WO | WO-2007148056 A1 * | 12/2007 | ......... H01S 3/06791 |

OTHER PUBLICATIONS

International Search Report and Written Opinion in Application No. PCT/US2022/044177, dated Dec. 22, 2022 (15 pgs.).

*Primary Examiner* — Robert H Kim
*Assistant Examiner* — Alina Kaliszewski

(57) ABSTRACT

A synthesizer including a controller configured to receive a first signal. A digital-to-analog converter (DAC) is coupled to the controller and is configured to generate a voltage bias based on the first signal. The voltage bias corresponds to a target resonant frequency. A semiconductor laser is coupled to the DAC and is configured to receive a second signal tone. The semiconductor laser generates a plurality of tone signals having octave multiples of a base sub-harmonic tone of the second signal tone.

20 Claims, 6 Drawing Sheets

(56) References Cited

U.S. PATENT DOCUMENTS

| | | | |
|---|---|---|---|
| 2005/0083137 A1* | 4/2005 | Lee | H03L 7/18 |
| | | | 331/16 |
| 2008/0266002 A1* | 10/2008 | Liu | H03L 7/193 |
| | | | 331/25 |
| 2010/0172383 A1* | 7/2010 | Montalvo | H01S 5/0683 |
| | | | 372/38.01 |
| 2013/0235710 A1* | 9/2013 | Maruyama | H01S 5/0657 |
| | | | 372/18 |
| 2016/0226215 A1* | 8/2016 | Podoleanu | H01S 5/146 |
| 2018/0115136 A1 | 4/2018 | Delfyett et al. | |
| 2023/0332879 A1* | 10/2023 | Vakoc | G01B 9/02091 |

\* cited by examiner

MULTI-OCTAVE SPANNING MILLIMETER WAVE SOURCE WITH PHASE MEMORY

RELATED APPLICATIONS

This application claims priority to U.S. provisional application No. 63/247,051 filed on Sep. 22, 2021, the contents of which is included herein in its entirety.

BACKGROUND

Quasi-optical RF and millimeter-wave (MMW) sources utilize a frequency comb (FC) generated by photonic integrated circuit (PIC) based mode locked (ML) semi-conductor lasers (SCLs). ML SCLs feature an inherent fixed-phase relationship between longitudinal modes within a laser resonator cavity. In essence, the longitudinal modes of the ML laser are mutually coherent. A longitudinal mode is a sinusoidal oscillation of a wave at a fixed frequency. As such, a mode locked laser-based synthesizer utilizes the interference between two or more waves of natural or resonant frequencies within a laser resonator cavity to produce superimposing sinusoidal waves with different frequencies defined by longitudinal mode frequency spacing to form resultant waves of frequencies governed by the difference in the natural or resonant frequencies generated by the frequency "comb." As such, a synthesizer can generate different frequencies defined by the mode locked laser waveform. Tunable radiofrequency (RF) or MMW tone generation is generated by modulating or tuning the two or more frequency component pairs from the ML SCL generated frequency comb.

Applications of wideband electronic warfare (EW) receivers or exciters, millimeter wave radar or related EW systems, and other high frequency applications, up to and including systems using W-band, require compact, low size, weight, power, and cost (SWaP-C) MMW sources or synthesizers with wideband frequency tunability. Current state of the art techniques cannot cover the full required bandwidths with a single frequency source, requiring multiple sources, mixing stages, or frequency doublers. In addition, a resulting multi-tone approach requires extensive filtering. The resulting systems are highly complex and inefficient, with a large SWaP-C footprint and commensurate substantial cost.

Synthesizers typically have multiple local oscillator (LO) tones possible. In cases where phase memory or extremely fast tuning is required (like EW applications), typically all of the tones are generated simultaneously. Then each tone must be filtered separately, and switches must be used to select the desired tone to send to the mixer. Amplifiers may also be required. High isolation is generally required, so it may require multiple stages of switches. Due to the loss of the filters and switches, additional amplification is generally required to meet the required LO power for passive mixers. Tunable LO sources such as phased-lock loops (PLLs) are often used where possible, but they cannot provide phase memory or high-speed tuning. All of this adds up to a very high size, weight, power, and cost (SWaP-C) solution. Some tunable filters have been employed, but they are typically high SWaP-C and have limited performance. Optical tunable filters have been utilized in other ways, but non-similar to the present disclosure, and none that generate the RF tones themselves.

Further, many applications require phase memory on a tunable local oscillator (LO), and no single-chip solution currently provides that. Single chip offerings (PLL/voltage-controlled oscillator (VCO) chips) require a separate chip for every required LO frequency such that they are fixed frequency. Phase memory can only be accomplished by multiplexing many of these devices, which dramatically increases SWaP-C. Additionally, architectures with both phase memory and tuning capability require mixing multiple fixed tones to get the desired tones, creating a high SWaP-C solution.

SUMMARY

According to one aspect of the subject matter described in this disclosure, a synthesizer is provided. The synthesizer includes a controller configured to receive a first signal. A digital-to-analog converter (DAC) is coupled to the controller and is configured to generate a voltage bias based on the first signal. The voltage bias corresponds to a target resonant frequency. A semiconductor laser is coupled to the DAC and is configured to receive a second signal tone. The semiconductor laser generates a plurality of tone signals having octave multiples of a base sub-harmonic tone of the second signal tone.

According to another aspect of the subject matter described in this disclosure, a method is provided. The method includes providing a first signal to a controller. Also, the method includes generating, by a digital-to-analog converter (DAC) coupled to the controller, a voltage bias based on the first signal. The voltage bias corresponds to a target resonant frequency. A second frequency signal tone is provided to a semiconductor laser coupled to the DAC. The second frequency signal tone includes a sub-harmonic multiple values of a frequency comb (FC) component. Furthermore, the method includes generating, by the semiconductor laser, an output signal when a specific tone signal or a plurality of tone signals all having mutual coherence and/or phase memory.

Additional features and advantages of the present disclosure is described in, and will be apparent from, the detailed description of this disclosure.

BRIEF DESCRIPTION OF THE DRAWINGS

The disclosure is illustrated by way of example, and not by way of limitation, in the figures of the accompanying drawings in which like reference numerals are used to refer to similar elements. It is emphasized that various features may not be drawn to scale and the dimensions of various features may be arbitrarily increased or reduced for clarity of discussion.

DETAILED DESCRIPTION

Figure 1:
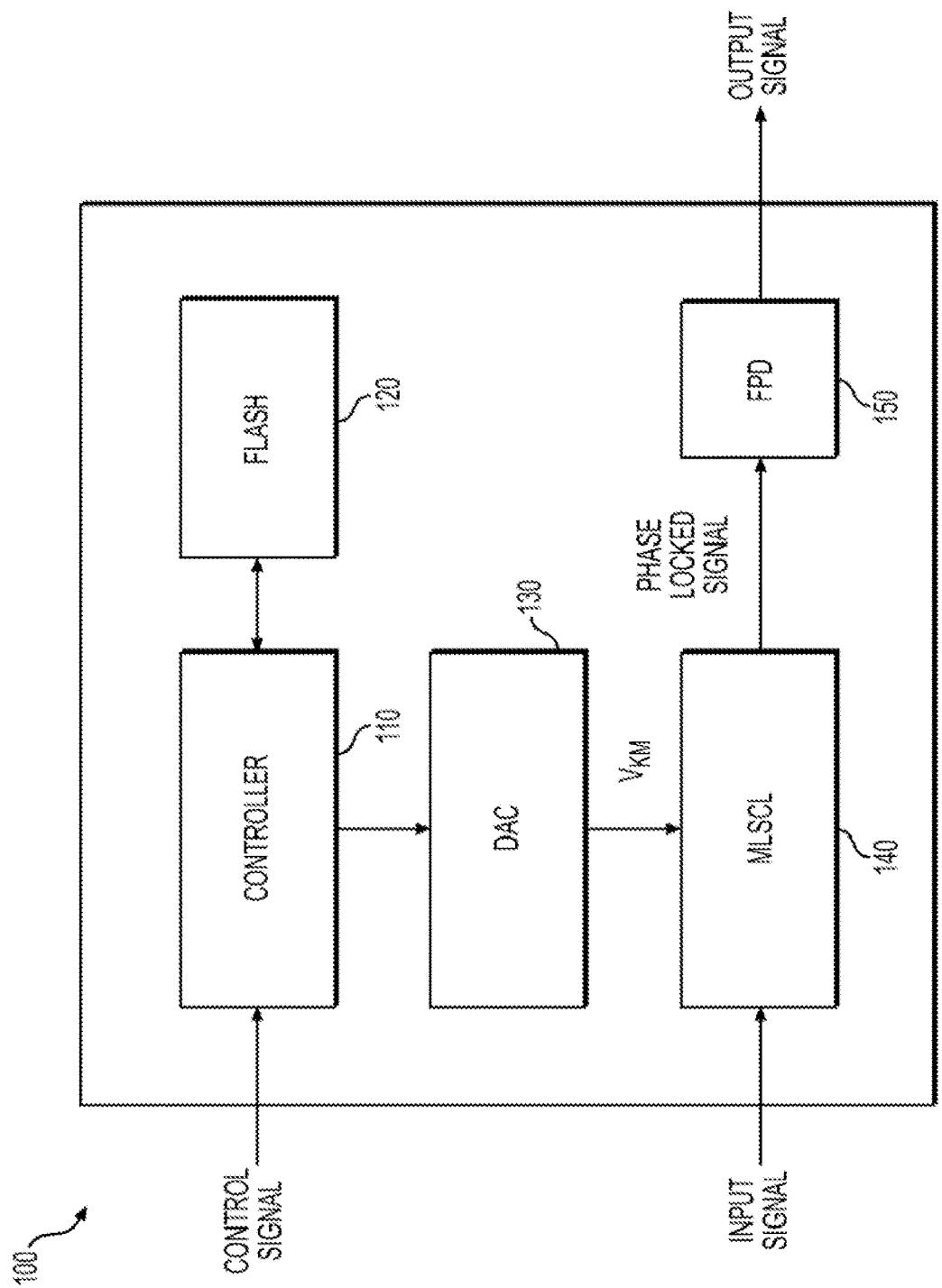
FIG. 1 is a schematic diagram of an exemplary tone selectable radio frequency (RF) synthesizer with phase-based memory, in accordance with some embodiments.

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may recognize that other elements and/or operations may be desirable and/or necessary to implement the devices, systems, and methods described herein. But because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

The terminology used herein is for the purpose of describing particular example embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc., may be used herein to describe various elements, components, regions, layers and/or sections, these elements, components, regions, layers and/or sections should not be limited by these terms. These terms may be only used to distinguish one element, component, region, layer or section from another element, component, region, layer, or section. That is, terms such as "first," "second," and other numerical terms, when used herein, do not imply a sequence or order unless clearly indicated by the context.

Disclosed herein are devices for addressing various problems and shortcomings of the state of the art, as described above. According to a first embodiment of the present disclosure there is provided a synthesizer comprising a controller configured to receive a first signal. The synthesizer also comprises a digital-to-analog converter (DAC) coupled to the controller and configured to generate a voltage bias based on the first signal, the voltage bias corresponding to a target resonant frequency. Further, the synthesizer includes a semiconductor laser, such as a mode locked semiconductor laser (MLSCL), coupled to the DAC and configured to receive a frequency signal/tone, which generates a plurality of frequencies/tones by the MLSCL— all being phase coherent with respect to each other which may be the source of desired RF local oscillator source(s) potentially spanning multi-octaves and all being phase coherent with respect to each other.

Here the MLSCL is configured to generate an output signal when a specific tone signal of the plurality of tone signals has a local oscillator frequency that corresponds to the target resonant frequency. The present disclosure therefore provides for a tunable synthesizer without the use of a PLL or voltage-controlled oscillator (VCO). The present disclosure also provides direct phase locking to a sub-harmonic reference frequency without a frequency divider.

This is a single-chip synthesizer solution providing both phase memory and tunability.

Due to inherent coherency of the FC components generated by the MLSCL, all the multi-octave frequencies of the injected sub-harmonic tone may be phase locked with inherent coherency with respect to each other. Furthermore, the MLSCL generates an output frequency tone that is the genesis of a RF local oscillator frequency source. Since the MLSCL generates multi-octave spanning frequencies based on the DAC/MLSLC generated specific frequency tone, the generated RF local oscillator frequency source(s) can be comprised of multiple octave spanning frequencies—all being mutually coherent f in phase.

The present disclosure enables a PLL-like frequency synthesis without the pitfalls of losing phase memory. According to an embodiment of the present disclosure, phase locked output frequency requiring no feedback mechanism is provided. This achieves variable (integer multiple) frequencies from single device. The use of the MLSCL allows for inherent phase coherency which enables phase memory and obviates the need for multiple fixed frequency sources. According to certain embodiments of the present disclosure, single MLSCLs near approximately millimeter wave center fundamental frequency architecture offers sub-harmonic to resonant tuning range spanning multi-octave ranges (10 MHz to 100 GHz).

FIG. 1 illustrates an exemplary tone selectable radio frequency (RF) synthesizer 100 with phase-based memory, in accordance with some embodiments. Synthesizer 100 comprises a controller 110 coupled to a non-volatile memory 120 such as a NAND flash memory. The controller 110 and the non-volatile memory 120 may be mounted onto a memory card that is detachably connected to the synthesizer 100. Controller 110 may also comprise a processor (not shown). The synthesizer 100 is configured to receive a control signal which is fed into the controller 110. The control signal contains information which configures the synthesizer 100 for operation. Synthesizer 100 further comprises a digital-to-analog converter (DAC) 130 coupled to the controller 110. Based on the information contained in the control signal, the controller 110 retrieves a voltage bias value VKM from the non-volatile memory 120 and instructs the DAC 130 to generate a voltage bias of a specified voltage bias value VKM. The voltage bias value VKM may be stored in the non-volatile memory 120. The DAC 130 is further coupled to a semiconductor laser 140 to which the DAC 130 provides the voltage bias.

The semiconductor laser 140 may comprise a mode locked semiconductor laser (MLSCL). An input signal may also be provided to the synthesizer 100, which is fed directly into the MLSCL 140. The input signal may comprise a plurality of tone signals, each having a local oscillator frequency. The MLSCL 140 receives the input signal and the voltage bias having a value VKM from the DAC 130 and generates a phase locked signal. The synthesizer 100 may further comprises a photodiode 150, such as fiber pigtailed photodiode, which receives the phase locked signal from the MLSCL 140 and generates an emission RF waveform as the output signal of the synthesizer 100. The phase locked signal from the MLSCL 140 may comprise of a single frequency tone generated by the MLSCL, or—if desired, multiple octaves of this tone which is be the source for the RF local oscillator or oscillators.

Figure 2:
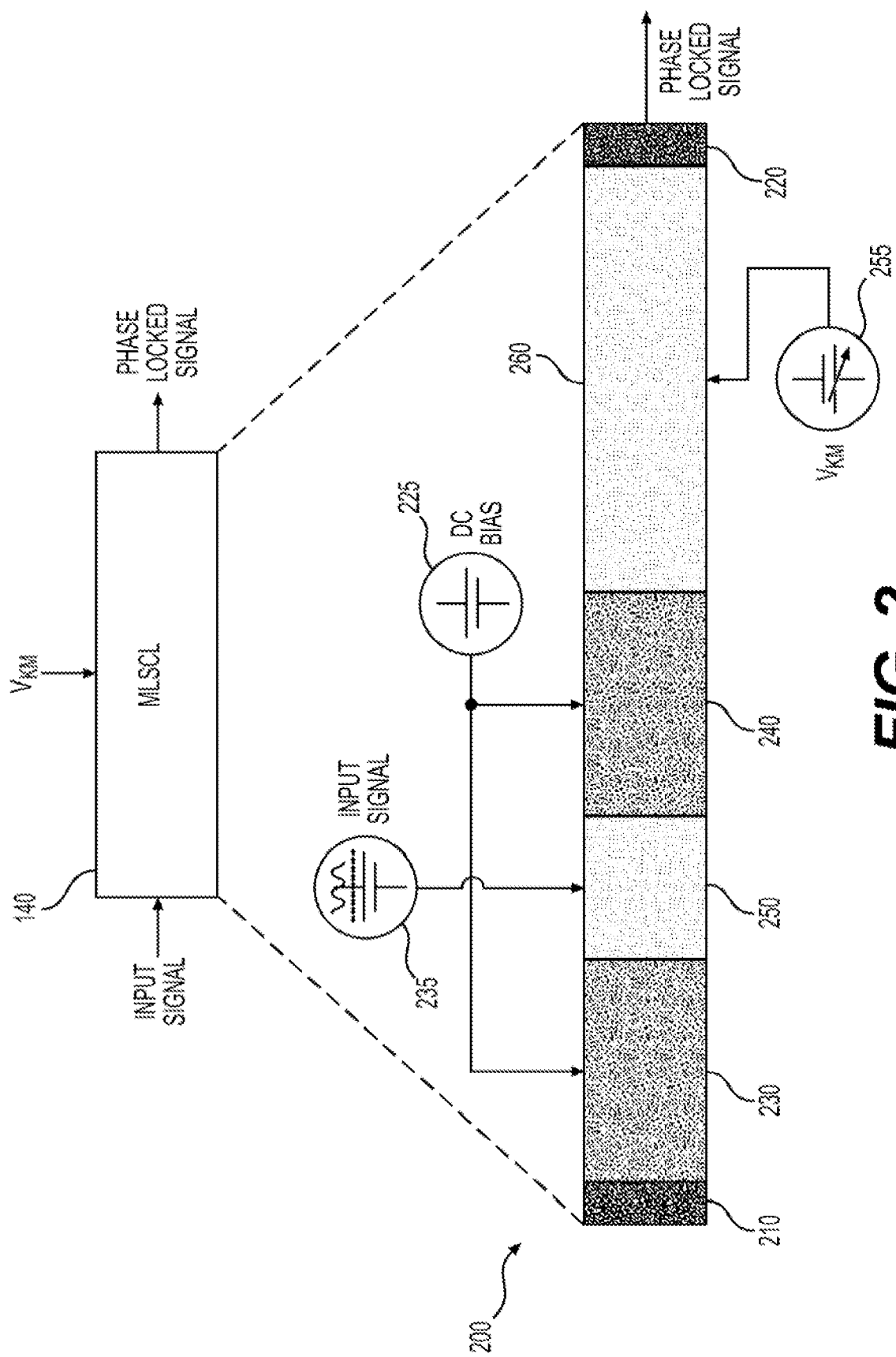
FIG. 2 is a schematic diagram of an exemplary structure of a mode locked semiconductor laser (MLSCL), in accordance with some embodiments.

FIG. 2 illustrates an exemplary structure of the MLSCL 140, in accordance with some embodiments. The MLSCL 140 comprises a laser resonator cavity 200 positioned between a first resonator mirror 210 and a second resonator mirror 220, in accordance with some embodiments. The first resonator mirror 210 and the second resonator mirror 220 may be formed by an etching or bonding process. Such process may be similar to that used in photonic integrated circuit (PIC) architectures. Alternatively, the first resonator mirror 210 and the second resonator mirror 220 may be defined by cleaved end faces of the resonator cavity with additional coatings where necessary. The laser resonator cavity 200 further comprises an active quantum well gain medium 230, 240, a saturable absorber 250, and an electro-optical modulator 260.

The gain medium 230, 240 may comprise Indium Gallium Arsenide-Phosphide (InGaAsP), for example, and may include one or more quantum wells. The gain medium is the source of optical gain within the MLSCL 140. The gain medium 230, 240 adds energy to amplify waveforms of an input signal provided to the laser resonator cavity 200. The gain is a result of the stimulated emission of the input signal waveforms through electronic transitions from a higher energy state to a lower energy state within the energy band gap of the gain medium 230, 240. To facilitate this, a voltage is provided to the gain medium 230, 240 via a DC voltage bias 225. In some embodiments, the DC voltage bias 225 may be 5 V. The DC bias 225 serves as an electrical charge pump for the gain medium 230, 240. Optionally, frequency modulation may also be applied via the DC voltage bias 225.

The frequency comb may include discrete lines with an exact constant spacing which equals the pulse repetition frequency $f_0$. As such, a frequency comb may include a series of optical pulses separated in time by a round-trip time $t_{RT}$ within the laser resonator cavity 200, where $t_{RT}=1/f_0$. The frequency comb may be defined by the dimensions of the laser resonator cavity 200 such length or separation between resonator mirrors. The frequency comb may also be defined by the optical elements disposed within the laser resonator cavity, such as an electro-optical modulator 260, as will be explained in more detail below. The frequency comb may include millimeter waves of the order of ~10 to 100 GHz.

The saturable absorber 250 is coupled to the gain medium 230, 240 and causes the formation of oscillating waveforms in the laser resonator cavity 200 when an input signal 235 is provided to it. Input signal 235 is similar to the input signal shown in FIG. 1. The saturable absorber 250 may comprise a solid (crystal, glass, polymer) or be constructed of similar material as that of the gain medium 230, 240. According to some embodiments, the saturable absorber 250 may comprise Indium Gallium Arsenide-Phosphide (InGaAsP), and variations thereof. The saturable absorber 250 may be electrically isolated from the gain medium voltage bias 225 (e.g., by an etching process). As such, gain medium 230, 240 may include an electrically isolated region in which the saturable absorber 250 is located that does not apply any gain to waveforms oscillating in the laser resonator cavity 200. In some embodiments, the input signal waveforms to the MLSCL—laser resonator cavity 200 may include a tuned frequency tone which can be a sub-harmonic of the frequency comb component generated by the MLSCL which results in MLSCL outputting the base frequency dictated by the DAC, and multi octave multiples of the base frequency afforded by the gain bandwidth of the MLSCL. The MLSCL frequency comb comprising equidistant optical frequency components inherently generates the multi octave spanning multiples of the base sub-harmonic injected frequency all being mutually coherent/in phase. The RF oscillator source can be chosen via RF amplifiers and appropriate filters to generate a single or multiple harmonic tones. The injection signal is employed via the intra-cavity saturable absorber element.

In some embodiments, the input signal 235 comprises of a frequency signal tone, which can then generate a plurality of tone signals. These mutually coherent frequency tones may be generated by selective RF amplifiers and filter combinations to choose a specific frequency for the RF local oscillator, or multiple octaves of base sub-harmonic frequency. The input signal 235 generated by the DAC is injected into the saturable absorber 250 of the MLSCL 140.

The electro-optical modulator 260 may comprise a material with a variable index of refraction, such as, for example, a Kerr crystal. The electro-optical modulator 260 may be disposed within the laser resonator cavity 200, and located downstream of the gain medium 230, 240. In some embodiments, the electro-optical modulator 260 may be positioned in closer proximity to the second resonator mirror 220 than the first resonator mirror 210. Voltage bias $V_{KM}$ 255 may be applied to the electro-optical modulator 260 to vary the electric field applied across the Kerr crystal. As previously described, voltage bias $V_{KM}$ is generated by the DAC 130 upon instruction by the controller 110 and the control signal.

The change in electric field in the electro-optical modulator 260 causes a change of refraction index of the Kerr crystal. This gives rise to polarization and/or change of optical phase of signals passing through the electro-optical modulator 260. The change in phase is proportional to the voltage bias 255 applied to the Kerr crystal. This means that only certain frequency tones in the input signal 235 are allowed to pass through the electro-optical modulator 260. Specifically, only the LO tones which have a frequency that match the resonant frequency corresponding to the voltage bias value $V_{KM}$ are allowed to pass. As such, the phase and frequency of waveforms passing through the electro-optical modulator 260 may be controlled by the voltage bias $V_{KM}$ applied to the electro-optical modulator 260. This results in a phase locked output signal from the MLSCL 140. In some embodiments of the present disclosure, the MLSCL 140 may be similar to that described in U.S. patent application Ser. No. 17/748,698, filed on May 19, 2022, the contents of which are hereby incorporated herein in entirety.

Figure 3:
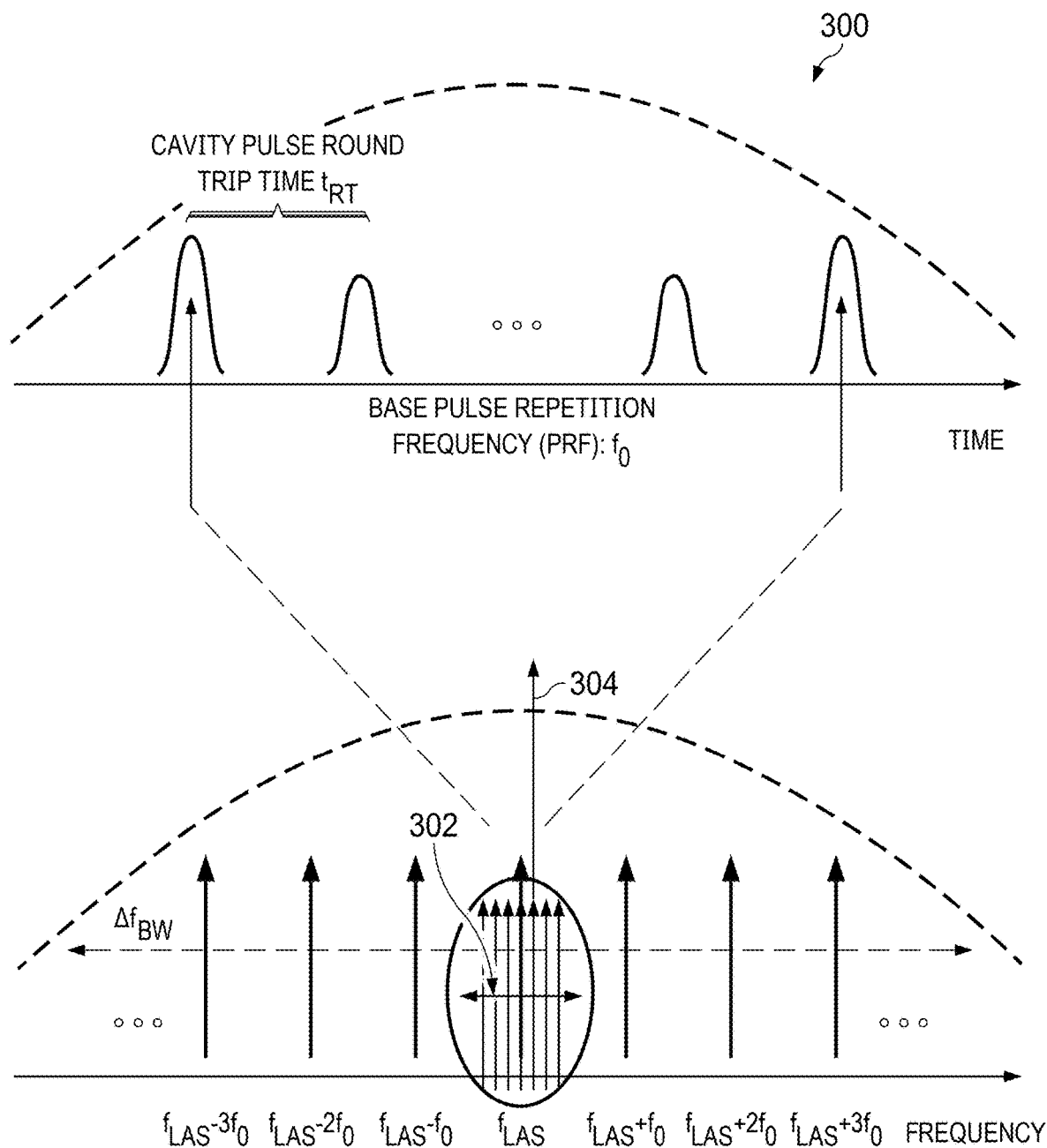
FIG. 3 is a schematic diagram of an input signal waveform comprising a frequency comb having equidistant optical frequency components, in accordance with some embodiments.

FIG. 3 illustrates an input signal waveform comprising a frequency comb 300 having equidistant optical frequency components with an exact constant spacing which equals the pulse repetition frequency $f_0$, in accordance with some embodiments. As described in the foregoing, voltage bias $V_{KM}$ applied to the electro-optical modulator 260 controls the operation of the MLSCL 140. In effect the voltage bias $V_{KM}$ sets the operation frequency $f_{LAS}$ of the MLSCL 140 such that input tone signals having an LO frequency that match the resonant frequency corresponding to the voltage bias value $V_{KM}$ are allowed to pass through the MLSCL 140. This is shown in FIG. 3 where an input signal 235 comprising a sub-harmonic tone with respect to frequency component in the FC. $N^{-1} f_0$ generates multiple octaves 302 of the base frequency tone (where output frequencies $f_s=N^{-1} f_0$): $M N^{-1} f_0$ with M ($\leq$N) limited by the bandwidth of the gain medium in the MLSCL. Multiples of the input tone signal having a frequency that match the resonant frequency 304 corresponding to the voltage bias value $V_{KM}$ are allowed to pass through the MLSCL 140. These signals are locked to the operation frequency $f_{LAS}$.

Figure 4A:
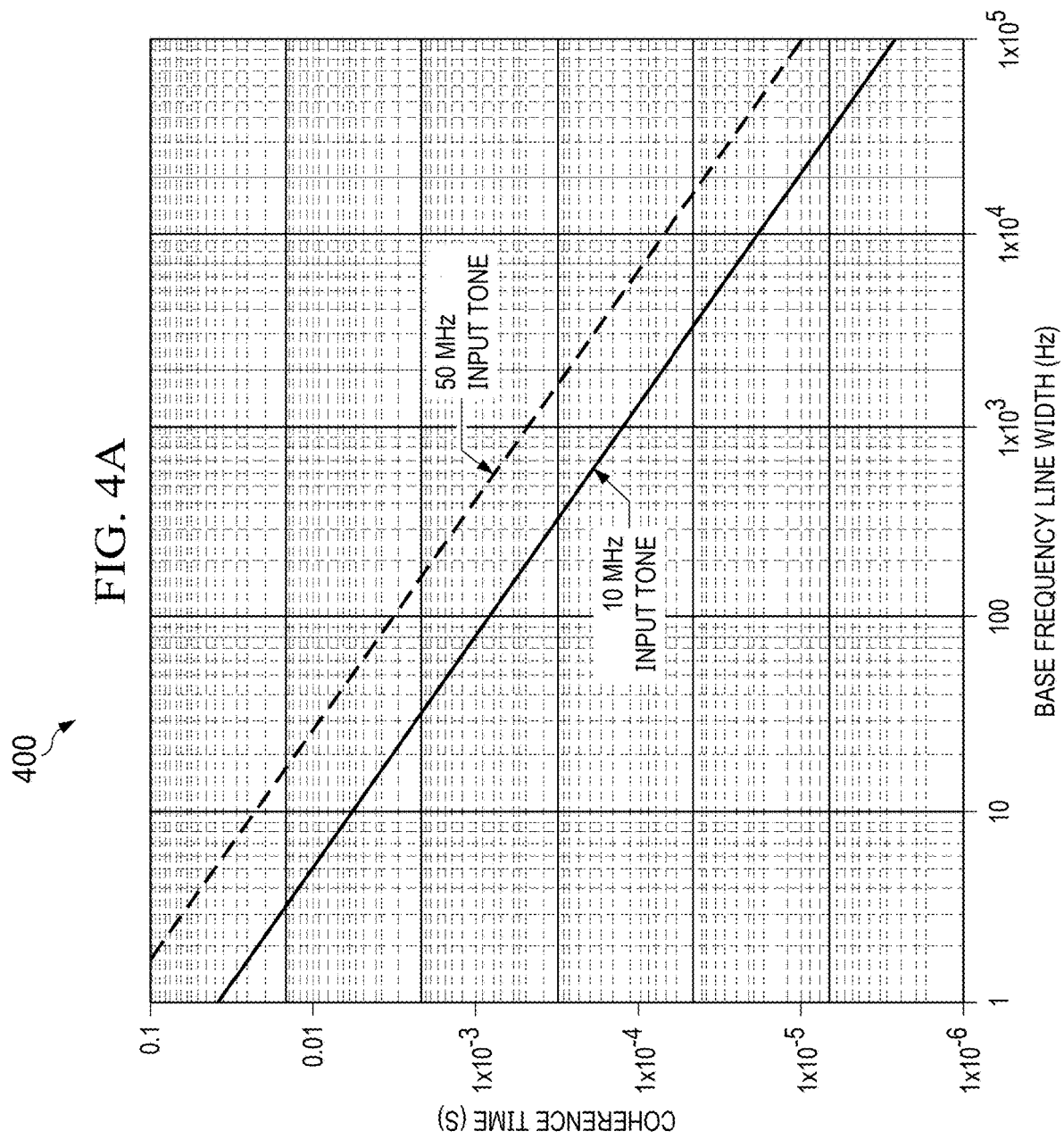
FIGS. 4A-4B are graphs of coherence between frequency comb tones in the MLSCL of FIG. 2, in accordance with some embodiments.
Figure 4B:
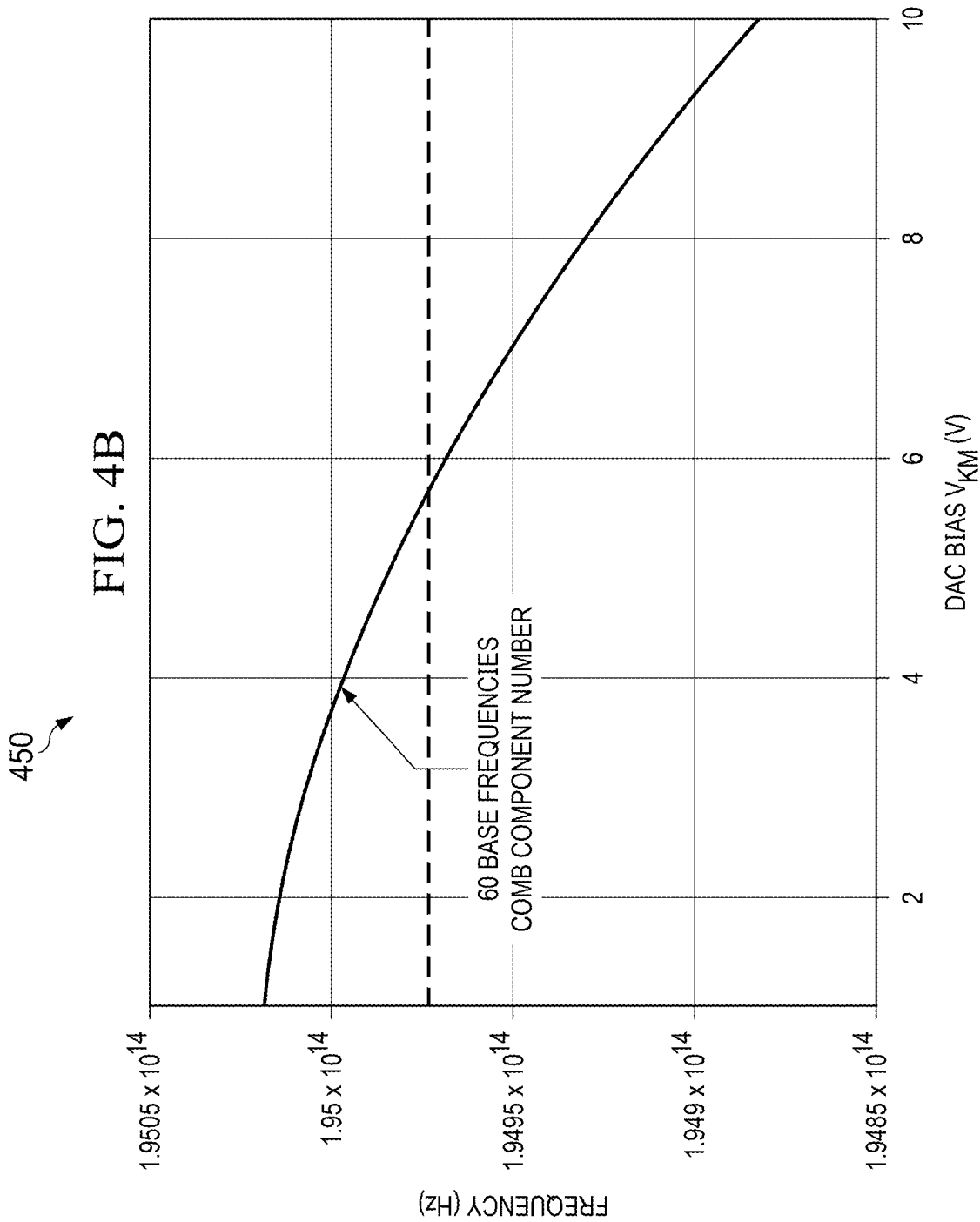

According to some embodiments, the phase memory (coherence) at the active saturable absorber lock is about 300 Hz for a center frequency of 10 MHz to 50 MHz. The coherence between frequency components in the generated sub-harmonic 235 and octave 302 multiples of this frequency can be instantiated up to a frequency of about 100 GHz, with an exemplary range of 1 Hz to $1 \times 10^5$ Hz shown in graph 400 of FIG. 4A. Allan deviation (ADEV) on common LO frequencies is well within the linewidth/frequency excursion of base frequency of the MLSCL 140 in free running mode. Inherent coherence between frequency comb LO tones in MLSCL 140, large gain bandwidth and long coherence time provides for multi-octave span millimeter wave generation with phase memory. Additionally, in some embodiments, locking with active saturable absorber tone input with a target line width of greater than about 100 Hz results in electronic warfare (EW) grade phase noise performance. Further, in some embodiments, the MLSCL optical gain bandwidth $\Delta f_{BW}$ is greater than about 3.1 THz for a 25 nm equivalent spectral gain bandwidth. At a nominal 40 GHz base $f_{LAS}$, shown in FIG. 3, the gain bandwidth sustains about 60 frequency comb components at a $V_{KM}$ bias voltage of less than about 6 V.

In view of the foregoing, it can be seen that bias voltage $V_{KM}$ is suitable for frequency tuning as it creates a resonance at the desired center frequency at an integer multiple of the reference frequency. Coherent length limits maximum N ratio of output/reference frequency that can achieve a phase lock. Using conservative gain-bandwidth values. N greater than 100,000 is achievable. A resonance range of 100 kHz enables coherent locking to reference without feedback as long as N×Reference variation. For example, for a 40 GHz output locked to a 10 MHz oscillator with an oscillator drift of 0.1 ppb, the maximum ratio of output/reference frequency is $4,000 \times 10^6 \times 10 \times 10^{-10} = 4$ Hz. According to some embodiments, fractional frequencies are also possible as long as least common multiple of reference frequency and output frequency is less than the maximum value of N.

Figure 5:
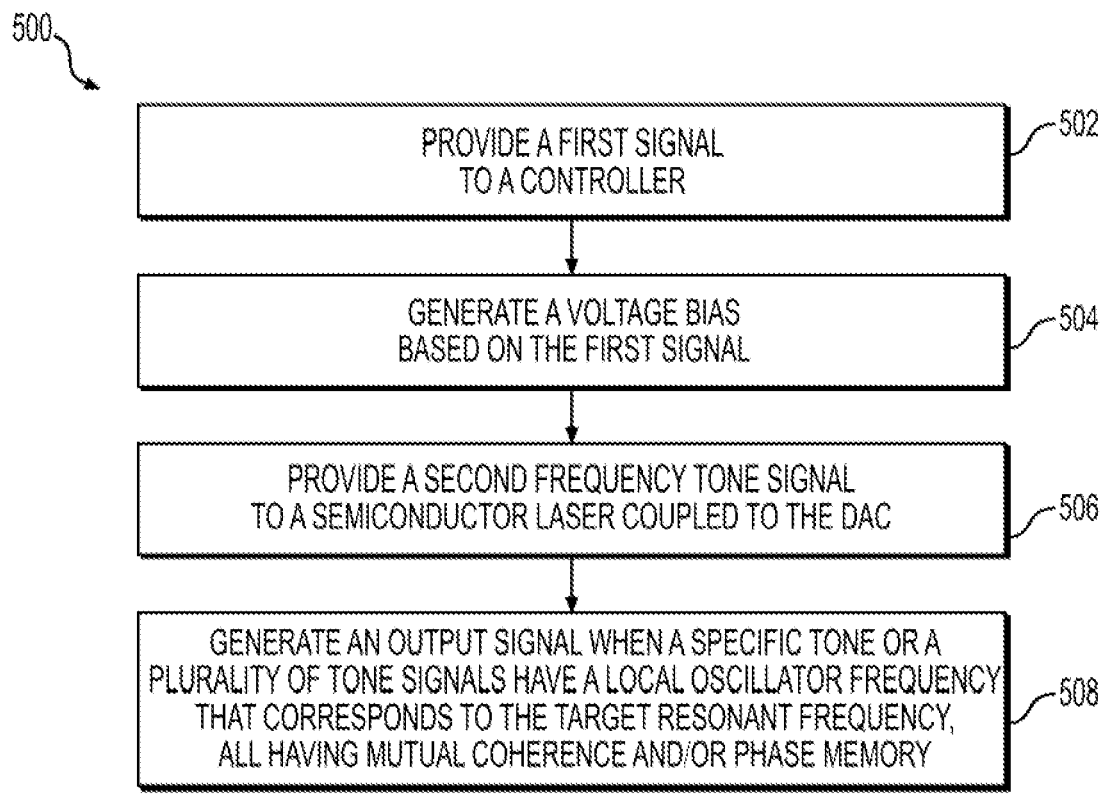
FIG. 5 is a process flowgraph of operations included in an example process 500 performed by a synthesizer, in accordance with some embodiments.

FIG. 5 is a process flowgraph of operations included in an example process 500 performed by a synthesizer, in accordance with some embodiments. Process 500 includes providing a first signal (such as control signal) to a controller (such as controller 110) (Step 502). Process 500 includes generating, by a digital-to-analog converter (such as DAC 130) coupled to the controller, a voltage bias (such as voltage bias 255) based on the first signal (Step 504). The voltage bias corresponds to a target resonant frequency. Moreover, process 500 includes providing a second frequency signal tone (such as input signal) to a semiconductor laser (such as MLSCL 140) coupled to the DAC (Step 506). The second frequency signal tone having a sub-harmonic multiple values of a frequency comb (FC) component. Furthermore, process 500 includes generating, by the semiconductor laser, an output signal (such as the phase locked signal of FIG. 1) when a specific tone signal or a plurality of tone signals have a local oscillator frequency that corresponds to the target resonant frequency, all having mutual coherence and/or phase memory (Step 508).

The disclosure describes a synthesizer architecture using a tunable MMW power oscillator that does not require power amplification (optical and/or RF). The advantages provided by the architecture include implementing a tunable synthesizer without using a PLL or VCO. The architecture allows direct phase locking to a sub-harmonic reference frequency without a frequency divider. Single-chip synthesizer solution is provided that includes both phase memory and tunability. The synthesizer architecture enables a PLL-like frequency synthesis without the pitfalls of losing phase memory. The phase-locked output frequency requires no feedback mechanism. The synthesizer architecture may achieve variable integer multiple/frequencies from a single device. An MLSCL-enabled phase memory may generate inherent phase coherency. Also, the synthesizer architecture obviates the need for multiple fixed frequency sources. Furthermore, the synthesizer architecture utilizes an MLSLO with a near ~MMW center fundamental frequency offering sub-harmonic to resonant tuning range spanning multi-octave (10 MHz-100 GHz).

Reference in the specification to "one implementation" or "an implementation" means that a particular feature, structure, or characteristic described in connection with the implementation is included in at least one implementation of the disclosure. The appearances of the phrase "in one implementation," "in some implementations." "in one instance," "in some instances," "in one case," "in some cases," "in one embodiment," "according to some embodiments." or "in some embodiments" in various places in the specification are not necessarily all referring to the same implementation or embodiment.

The foregoing is merely illustrative of the principles of the disclosure, and the devices and methods can be practiced by other than the described implementations, which are presented for purposes of illustration and not of limitation. It is to be understood that the devices described herein, while shown in respect of a multi-octave spanning millimeter wave source with phase memory, may be applied to other systems in which frequency tuning of lasers is desired.

Those skilled in the art will appreciate that certain modifications can also be made to the present disclosure without departing from the scope of the same. It is to be understood that the devices described herein, while shown with respect to a radio frequency or millimeter wave synthesizer with continuous ultra-wide bandwidth tuning range, may be applied to other systems in which continuous ultra-wide bandwidth tuning is desired. While several embodiments of the disclosure have been shown in the drawings, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

Elements, equations, or steps of different implementations described may be combined to form other implementations not specifically set forth previously. Elements, equations, or steps may be left out of the lasers or processes described previously without adversely affecting their operation or the operation of the laser in general. Furthermore, various separate elements, equations, or steps may be combined into one or more individual elements or steps to perform the functions described in this specification. It should be understood by one skilled in the art that equations set forth herein may be otherwise expressed in a different form or manner with different underlying assumptions, thus not specifically set forth. In the foregoing disclosure, it will be understood that the term 'about' should be taken to mean±20% of the stated value.

Variations and modifications will occur to those of skill in the art after reviewing this disclosure. The disclosed features may be implemented, in any combination and sub-combination (including multiple dependent combinations and sub-combinations), with one or more other features described herein. The various features described or illustrated above, including any components thereof, may be combined or integrated in other systems. Moreover, certain features may be omitted or not implemented.

Examples of changes, substitutions, and alterations are ascertainable by one skilled in the art and could be made without departing from the scope of the information disclosed herein. All references cited herein are incorporated by reference in their entirety and made part of this application. Other implementations not specifically described in this specification are also within the scope of the claims.

What is claimed is:

1. A synthesizer comprising:
   a controller configured to receive a first signal;
   a digital-to-analog converter (DAC) configured to generate a voltage bias based on the first signal, the voltage bias corresponding to a target resonant frequency; and
   a semiconductor laser configured to receive the voltage bias from the DAC, receive a second signal tone, and generate a plurality of tone signals having octave multiples of a base sub-harmonic tone of the second signal tone.

2. The synthesizer of claim 1, wherein the semiconductor laser is configured to generate an output signal when a specific tone signal of the plurality of tone signals has a local oscillator frequency that corresponds to the target resonant frequency.

3. The synthesizer of claim 2, wherein the output signal is phase-locked to the local oscillator frequency of the specific tone signal.

4. The synthesizer of claim 2, wherein the output signal comprises the specific tone signal having the local oscillator frequency that corresponds to the target resonant frequency.

5. The synthesizer of claim 4, wherein the tone signals having a local oscillator frequency different to the target resonant frequency are filtered out by the semiconductor laser.

6. The synthesizer of claim 2, wherein the semiconductor laser comprises a saturable absorber configured to receive a sub-harmonic multiple value of a frequency comb (FC).

7. The synthesizer of claim 6, wherein the semiconductor laser is a mode locked semiconductor laser (MLSCL) with an electro-optical modulator that is configured to alter an optical path length of the MLSCL upon receipt of the voltage bias such that only the specific tone signal is generated as the output signal.

8. The synthesizer of claim 1, further comprising a non-volatile flash memory configured to store a look-up table populated with a plurality of target resonant frequencies of the semiconductor laser, each target resonant frequency having a corresponding voltage bias value.

9. The synthesizer of claim 8, wherein the controller is configured to provide a retrieved voltage bias value from the look-up table to the DAC for the generation of the voltage bias.

10. The synthesizer of claim 1, further comprising a photodiode configured to generate an emission RF waveform upon impingement by an output signal from the semiconductor laser.

11. A method comprising:
    providing a first signal to a controller;
    generating, by a digital-to-analog converter (DAC), a voltage bias based on the first signal, the voltage bias corresponding to a target resonant frequency;
    providing a second frequency signal tone to a semiconductor laser, the second frequency signal tone having sub-harmonic frequencies equal to multiple values of a frequency comb (FC) component, wherein the semiconductor laser receives the voltage bias from the DAC; and
    generating, by the semiconductor laser, an output signal when a specific tone signal or a plurality of tone signals have mutual coherence and/or phase memory.

12. The method of claim 11, wherein the output signal is phase-locked to a local oscillator frequency of the specific tone signal.

13. The method of claim 11, further comprising:
    generating, by the semiconductor laser, the plurality of tone signals from an injected base sub-harmonic tone signal of the second frequency signal tone.

14. The method of claim 11, further comprising:
    generating, by the semiconductor laser, the plurality of tone signals comprising multiple octaves of a base sub-harmonic tone signal of the second frequency signal tone.

15. The method of claim 11, further comprising:
    injecting a base sub-harmonic tone signal into a saturable absorber of the semiconductor laser.

16. The method of claim 11, further comprising:
    altering, by an electro-optical modulator of the semiconductor laser, an optical path length of the semiconductor laser upon receipt of the voltage bias.

17. The method of claim 11, further comprising:
    storing, in a non-volatile flash memory, a look-up table populated with a plurality of target resonant frequencies of the semiconductor laser, each target resonant frequency having a corresponding voltage bias value.

18. The method of claim 17, further comprising:
    retrieving, from the non-volatile flash memory, a voltage bias value corresponding to the target resonant frequency of the semiconductor laser.

19. The method of claim 18, further comprising:
    providing, by the controller, the retrieved voltage bias value to the DAC for the generation of the voltage bias.

20. The method of claim 11, further comprising:
    generating, by a photodiode coupled to the semiconductor laser, an emission RF waveform upon impingement by an output signal from the semiconductor laser.

* * * * *